United States Patent

[11] 3,617,287

[72] Inventor William Jeffers
Fair Haven, N.J.
[21] Appl. No. 664,280
[22] Filed Aug. 30, 1967
[45] Patented Nov. 2, 1971
[73] Assignee E. I. du Pont de Nemours and Company
Wilmington, Del.

[54] PHOTOPOLYMERIZABLE ELEMENTS CONTAINING A YELLOW DYE
7 Claims, No Drawings

[52] U.S. Cl. .......... 96/84 R, 96/115 P, 96/87 R
[51] Int. Cl. .......... G03c 1/68
[50] Field of Search .......... 96/84, 87, 115, 115 P

[56] References Cited

UNITED STATES PATENTS

| | | | |
|---|---|---|---|
| 3,038,800 | 6/1962 | Luckey et al. | 96/115 X |
| 3,053,745 | 9/1962 | Levinos | 204/158 |
| 3,201,255 | 8/1965 | Mueller et al. | 96/115 |
| 3,458,311 | 7/1969 | Alles | 96/115 X |

FOREIGN PATENTS

| | | | |
|---|---|---|---|
| 893,063 | 4/1962 | Great Britain | 96/115 |

OTHER REFERENCES

Mees; C. E., " The Theory of the Photographic Process," 1954, pg. 364

Neblette; C. B., " Photography Its Materials and Processes," Sixth Ed., 1962, pg. 206

*Primary Examiner*—Ronald H. Smith
*Attorney*—Lynn Barratt Morris

ABSTRACT: An improved photopolymer image reproduction element having in a photopolymerizable layer containing an initiator that absorbs light in the ultraviolet and visible region of the spectrum a yellow, light-absorbing dye from the group consisting of oxazoline styryl salts, symmetrical thiazoline carbocyanine salts, and pyrazolinone styryl dyes, said dyes absorbing light in the ultraviolet and/or visible regions of the spectrum.

PHOTOPOLYMERIZABLE ELEMENTS CONTAINING A YELLOW DYE

BACKGROUND OF THE INVENTION

1. Field of the Invention

The present invention relates to the general field of photopolymerizable image forming elements for thermal transfer and printing relief purposes. It pertains more specifically to an improved element which incorporates certain photographic silver halide sensitizing dyes in the photopolymerizable layers whereby image quality and increased exposure latitude are attained without decrease in speed.

2. Description of the Prior Art.

The prior art describes the use of dyes in photopolymerizable layers containing ethylenically unsaturated monomers and initiators activatable by actinic light. The prior art indicates dyes that absorb radiation in the actinic region of the photoinitiator will decrease the speed of the photopolymerizable layer and they should be avoided if speed is important. See Plambeck U.S. 2,791,504. Dyes are proposed also for use in various prior art photopolymerizable elements to facilitate readout of the addition polymer image. See U.S. Pats. to Burg and Cohen 3,060,023 and 3,217,167; Cohen and Luebbe 3,198,633; Luebbe 3,219,818; Cohen 3,275,437; and Heiart 3,307,943.

A preferred embodiment of the present invention is concerned with an improvement of the photopolymerizable elements disclosed in assignee's copending application of F. P. Alles U.S. Pat. Ser. No. 560,889 filed June 27, 1966 (now abandoned but first refiled as continuation-in-part application Ser. No. 690,732 filed Dec. 15, 1967, U.S. Pat. No. 3,458,311 July 29, 1969). The element disclosed in the Alles application comprises a support, which may have an antihalation layer coated on it, a photopolymerizable layer described in detail and a solid adherent protective stratum which is integral and nonstrippable and composed of specified polymers or polymer mixtures. In using the elements disclosed in the Alles application and in using other similar prior art elements, it is sometimes quite difficult to reproduce faithfully both extreme highlight and deep shadow areas in the same halftone exposure. The present invention overcomes this shortcoming, without causing any loss in photographic speed, by incorporating one of the specific dyes described below directly in the photopolymerizable layer, thereby eliminating the need to coat a separate antihalation layer.

SUMMARY OF THE INVENTION

An improved photopolymerizable element which comprises a support and a photopolymerizable layer containing at least one nongaseous ethylenically unsaturated monomer, an addition polymerization initiator that absorbs and is activated by actinic radiation in the ultraviolet and visible region of the spectrum and a macromolecular organic polymer binder for the monomer and initiator, characterized in that the polymerizable layer contains a yellow photographic sensitizing dye of the group consisting of oxazoline styryl salts, symmetrical thiazoline carbocyanine salts, and pyrazolinone styryl dyes. The element may also contain an integral protective layer over the photopolymerizable layer.

When a photopolymerizable element which does not incorporate the specific dyes of this invention is exposed through a halftone screen to actinic radiation, a certain amount of light scattering occurs in the lateral direction within the photosensitive layer. This scattering causes growth or apparent overexposure of the highlight dot areas and filling-in or apparent overexposure of the shadow dot areas. Addition of any standard filter dye which absorbs selectively in the actinic region would tend to reduce light scattering, but would also cause a substantial reduction in overall speed or rate of polymerization initiation within the image forming layer. Addition of one of the photographic silver halide sensitizing dyes described herein not only results in reduction of light scattering with the resultant improvement in exposure latitude and definition, but accomplishes this result with no measurable decrease in speed.

DESCRIPTION OF THE PREFERRED EMBODIMENTS

In general, the invention comprises, in order, (1) a base support of the types described in U.S. Pat. No. 2,791,504, and (2) a layer of photopolymerizable material, containing a. at least one nongaseous ethylenically unsaturated compound capable of forming a high polymer by photoinitiated addition polymerization including those listed in Burg & Cohen Pat. No. 3,060,023; Celeste & Bauer Pat. No. 3,261,686; and assignee's application, U.S. Pat. Ser. No. 370,338 filed May 26, 1964 by Cohen & Schoenthaler, now Pat. No. 3,380,831 b. an addition polymerization initiator which absorbs and is activated by ultraviolet or visible light, including those organic free-radical-generating addition polymerization initiators listed in U.S. Pat. No. 3,060,023, especially the polynuclear quinones which are inactive thermally below 185° C., and contains also c. a photographic silver halide sensitizing dye chosen from the groups of light-absorbing, yellow dyes given below, which absorb light in the ultraviolet and/or visible spectral regions. The dyes are used in amounts of 0.25 percent to 2.7 percent by weight of the solids content of the layer which preferably has a coating weight, when dry, of 1 to 90 mg./dm.$^2$.

In addition, the element may also have a protective stratum of a strippable material as described in Heiart U.S. Pat. No. 3,060,026, or a nonstrippable material as described in Burg, U.S. Pat. No. 3,203,805 and the above-mentioned Alles application. Other colorant materials, e.g., dyes used solely for coloration, organic or inorganic fillers and the polymeric binders listed in U.S. Pat. No. 3,060,023 can be used.

The photographic silver halide sensitizing dyes used in accordance with this invention absorb radiation in the region actinic to the photoinitiator, without causing any measurable decrease in the rate of photopolymerization initiation. Suitable such dyes which do not affect speed are included in the following groups:

(1) Oxazoline styryl salts of the formula;

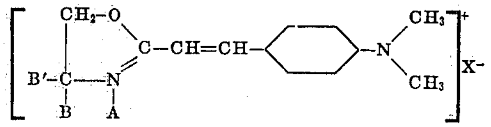

where A is an alkyl group of from one to 18 carbon atoms; B and B' are alkyl or hydroxyalkyl groups of from one to 5 carbon atoms or hydrogen; and X is an anion of an acid, e.g., Cl, Br, p-toluene sulfonate, $-NO_3$, $C_2H_5SO_4-$, etc.

(2) Symmetrical thiazoline carbocyanine salts of the formula;

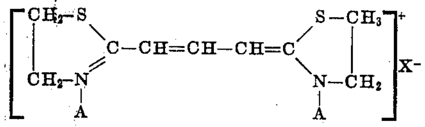

where A and X are the same as in item (1).

(3) Pyrazolinone styryl dyes

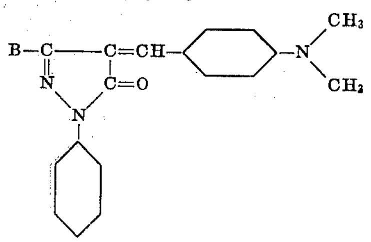

where B is alkyl of from one–five carbon atoms.

Suitable alkyl radicals include methyl, ethyl, n-propyl, n-butyl, n-pentyl, hexyl, octyl, dodecyl and octadecyl; and suitable hydroxyalkyl radicals include hydroxymethyl, -ethyl, -n-propyl, -n-butyl and -n-pentyl. The photopolymerizable elements of this invention can be used in thermal image transfer processes as disclosed in U.S. Pat. Nos. 3,060,023, 3,060,026, and other patents listed above, room temperature image transfer as in Heiart U.S. Pat. No. 3,202,508, or by washing to form a relief as in Plambeck U.S. Pat. No. 2,760,863.

The following examples illustrate the present invention and several preferred embodiments of it, but are not intended to limit the scope of the invention.

EXAMPLE I

The following photopolymerizable solutions were prepared:

Solution A

| Component | Weight |
|---|---|
| Pentaerythritol triacrylate (U.S. Pat. No. 3,261,686, July 19, 1966) | 40.6 g. |
| Poly(methyl methacrylate/methacrylic acid) (90/10 mole ratio) | 62.4 g. |
| Triethylene glycol diacetate | 12.8 g. |
| Tertiary butylanthraquinone | 0.94 g. |
| Phenanthrenequinone | 0.72 g. |
| Pontacyl Wool Blue GL (C.I. Acid Blue 102) | 1.6 g. |
| 2-Ethoxyethanol | 340.0 g. |

SOLUTION B

| Component | Weight |
|---|---|
| Solution A | 100.0 g. |
| Yellow dye (3-hexadecyl, 4-hydroxymethyl, 4-methyl, 2-p-dimethylaminostyryl oxazoline nitrate) | 1.0 g. |
| 2-Ethoxyethanol | 20.0 g. |

Solution B was pour-coated on a plate of nontreated, brush-grained aluminum, allowed to dry, and overcoated with a 3 percent aqueous solution of polyvinyl alcohol as described in Alles, U.S. Pat. Ser. No. 560,889, example I.

The plate was exposed for 2 minutes through a halftone negative containing both 2 percent highlight dots and 98 percent shadow dots on a Nu Arc "Flip-Top" Plate Maker, Model FT26L, to the xenon light source.

The plate was developed in the following washoff solution.

SOLUTION C

| Component | Volume, ml. |
|---|---|
| 10% by weight solution of octylphenoxyethoxyethanol of the formula | |

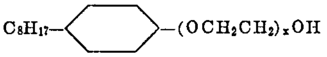

| | |
|---|---|
| where X is 9-10 | 2.0 |
| 10% by weight $NaPO_4 \cdot 12H_2O$ | 25.0 |
| 2-butoxyethanol | 60.0 |
| Water to | 1000.0 |

The 2 percent highlight dots were visible on the developed plate and the 98 percent shadow dots were unplugged. Comparison with a similar plate with no added yellow dye showed no change in speed due to such dye.

Plates containing and free from the yellow dye were mounted on a Heidelberg KOR single color offset press. By using a conventional fountain solution and black offset ink, initial impressions and those after 5,000 impressions were made. The plate containing the yellow dye had better fine highlight dots and shadow dots than the plate with no yellow dye.

EXAMPLE II

The following solution was pour-coated on a sheet of nontreated, brush-grained aluminum.

SOLUTION D

| Component | Amount |
|---|---|
| Solution of Example I | 100.0 g. |
| Yellow dye (see Example I, Solution B) | 0.3 g. |
| 2-ethoxyethanol | 50.0 g. |

A second plate was coated with Solution A only. Both plates were then overcoated as in example I.

After the plates were dried, each was cut into 6 parts, each part being exposed through a halftone transparency containing both 2 percent highlight dots and 98 percent shadow dots for varying amounts of time. The Nu Arc xenon light source of example I was used.

The results are shown in the table below.

| Plate | Exposure Time | Highlight Dot Size (μ.) | Shadow Dot Size (μ.) |
|---|---|---|---|
| Original halftone transparency | | 27 | 26 |
| Solution A only | 30 sec. | 27 (ragged) | 24 (not round) |
| Solution A only | 1 min. | 26-30 (rugged) | not visible |
| Solution D | 30 sec. | 26-28 | 26-30 |
| Solution D | 1 min. | 25-28 | 26-29 |
| Solution D | 2 min. | 25- 28 | 24-29 |
| Solution D | 4 min. | 25-28 | 20-24 |
| Solution D | 8 min. | 29-34 | 14-16 |

The results shown above illustrate the ability of the plate containing the yellow filter dye to reproduce the 2 percent highlight dots and the 98 percent shadow dots over an extraordinarily broad range of exposure times. In addition, measurements indicated that there was no change in speed between the plate that contained the yellow dye and the one that did not. 1,500

EXAMPLE III

The element described in example II which has the yellow dye in the photopolymerizable layer was exposed for 45 seconds to the Nu Arc xenon light source, through an Itek, high contrast, 3-line, 3:1 ratio, equal line distance resolving power chart transparency. The image obtained after development as in example I exhibited a resolving power of approximately 1500 lines/inch.

EXAMPLE IV

A nontreated, brush grained aluminum plate was pour-coated with the following solution.

Solution E

| Component | Amount |
|---|---|
| Poly(methylmethacrylate/methacrylic acid) (90/10 mole ratio) | 18.0 g. |
| Pentaerythritol triacrylate | 12.0 g. |
| Triethylene glycol diacetate | 3.7 g. |
| Wool Blue Dye (C.I. Acid Blue 16) | 0.5 g. |
| Yellow dye (Example I, Solution B) | 0.15 g. |
| 9,10-Phenanthrenequinone | 0.5 g. |
| 2-Ethoxyethanol to a total composition wt. of | 200.0 g. |

The plate was then cut in half and one half was overcoated with the polyvinyl alcohol solution of example I. The overcoated plate was exposed for approximately 70 seconds to the Nu Arc xenon light source through a halftone transparency containing 2 percent highlight dots and 98 percent shadow dots. After processing as in example I, it was found that both the 2 percent highlight dots and the 98 percent shadow dots were faithfully reproduced.

The plate with no overcoat layer was exposed for approximately 2 minutes as above and, except for the increased exposure time required by the absence of an oxygen barrier overcoat, the image quality was comparable to the overcoated plate.

EXAMPLE V

The following solution was prepared:

| Solution F Component | Amount |
|---|---|
| Poly(methylmethacrylate/methacrylic acid) | 62.0 g. |
| Pentaerythritol triacrylate | 40.0 g. |
| Triethylene glycol diacetate | 3.0 g. |
| Pontacyl Wool Blue GL (C.I. Acid Blue 102) | 1.0 g. |
| | Amount |
| Yellow dye (bromide salt form of Example I yellow dye) | 1.0 g. |
| Phenanthrenequinone | 1.5 g. |
| 2-Ethoxyethanol to a total composition wt. of | 394.0 g. |

This solution was pour-coated onto a plate of nontreated, brush grained aluminum. The plate was then cut in half with one half being overcoated as in Example I. Exposure for 20 seconds as in Example I and development in a solution that was the same as Solution C of Example I, except for the use of 125 ml. of 10 percent $Na_3PO_4 \cdot 12H_2O$, instead of 25 ml., yielded 2 percent highlight dots 28$\mu$ in diameter and shadow areas which remained open.

The nonovercoated plate was exposed for approximately 60 seconds, the increase in time necessitated by the absence of an oxygen barrier layer, and processed as above. Image quality comparable to that of the overcoated plate was obtained.

EXAMPLE VI

The photopolymerizable solution of example V was prepared, except that no blue dye was included. The solution was pour-coated onto an aluminum plate which was dried, exposed, and processed as in example V. Except for the fact that the speed of the plate doubled due to the absence of the blue dye, image quality was comparable to that found in the plates of example V.

EXAMPLE VII

The following solution was prepared.

| SOLUTION G Component | Amount |
|---|---|
| Polymethylmethacrylate | 406.0 g. |
| 2-Ethoxyethanol | 2000.0 g. |
| 9,10-Phenanthrenequinone | 7.2 g. |
| Tertiary butylanthraquinone | 9.4 g. |
| Oil Blue Dye (C.I. Solvent Blue 36) | 14.0 g. |
| Yellow dye (as in Example I) | 10.0 g. |
| Pentaerythritol triacrylate | 406.0 g. |
| Triethylene glycol diacetate | 128.0 g. |
| 2-Ethoxyethanol to a total composition wt. of | 4000.0 g. |

An aluminum plate coating as in example I was made and the plate was dried, overcoated as in example I, exposed for 85 seconds, and processed as in example I, except that an additional 25 percent 2-butoxyethanol was added to the processing solution.

It was concluded that the substitution of polymethylmethacrylate binder in place of the poly(methylmethacrylate/methacrylic acid) combination had no effect on the improvement achieved by the incorporation of the yellow filter dye.

EXAMPLE VIII

The following solutions were prepared:

| Component | Solution H, g. | I, g. | J, g. | K, g. | L, g. |
|---|---|---|---|---|---|
| Solution A, Example I | 100 | 100 | 100 | 100 | 100 |
| 3,3'-ethyl thiazolinocarbocyanine iodide | | 0.2 | | | |

EXAMPLE VIII – Continued

The following solutions were prepared:

| Component | Solution H, g. | I, g. | J, g. | K, g. | L, g. |
|---|---|---|---|---|---|
| 1-phenyl, 3-methyl, 4-(p-dimethylaminobenzilidene, 5-pyrazolinone) | | | 0.2 | | |
| 3,3'-hexadecyl thiazolinocarbocyanine bromide | | | | 0.12 | |
| 3,3'-dodecyl thiazolinocarbocyanine bromide | | | | | 0.12 |
| 2-ethoxyethanol | 50 | 50 | 50 | 50 | 50 |

Each solution was pour-coated on a nontreated, brush grained aluminum plate, allowed to dry, overcoated with the polyvinyl alcohol coating of Example I, and exposed for 1 to 1½ minutes to the Nu Arc xenon light source.

The plates coated with solutions I through L reproduced both the 2 percent highlight dots and the 98 percent shadow dots of the original transparency. The plate coated with Solution H reproduced the 2 percent highlight dots, but had the shadow areas plugged so that no dots were visible. Exposure through a $2\sqrt{2}$ step wedge indicated no significant difference in speed between the plates containing the filter dyes and that plate without the filter dye.

EXAMPLE IX

The following solution was prepared:

| SOLUTION M Component | Weight |
|---|---|
| 2-Ethoxyethanol | 100.0 g. |
| 0.7% phenanthrenequinone in ethyl cellosolve | 308.4 g. |
| Pentaerythritol triacrylate | 130.8 g. |
| Poly(methylmethacrylate/methacrylic acid) (90/10 mole ratio) | 187.2 g. |
| Tertiary-butylanthraquinone | 2.9 g. |
| Triethylene glycol diacetate | 38.4 g. |
| Yellow dye (see Example V) | 3.0 g. |
| 1.1% Blue dye solution in 2-ethoxyethanol (C.I. Acid Blue 102) | 374.2 g. |

The solution was coated on two brush-grained, hot water washed, nontreated aluminum plates to a coating thickness of approximately 45 mg./dm.$^2$. One plate was then laminated to a sheet of transparent polyethylene terephthalate, 0.00025 inch thick. The other plate was overcoated with a solution containing 60.0 g. of polyvinyl alcohol, 1.2 g. of the octylphenoxyethoxyethanol and 938.8 g. of water. The overcoat thickness was approximately 12mg./dm.$^2$.

Both plates were exposed to the Nu Arc xenon light source for 2 minutes. The sheet of polyethylene terephthalate was peeled from the first plate and then both plates were processed in solution C of example I except that sufficient $NaH_2PO_4H_2O$ to achieve a solution pH of 11.0 was added.

The image quality was acceptable as both the 2 percent highlight and 98 percent shadow dots were visible on both plates with no apparent reduction in plate speed. No significant effect was apparent due to the difference in barrier layer material.

EXAMPLE X

Solution M of example IX was coated on a sheet of 0.004 inch thick polyethylene terephthalate which had been coated with a subbing solution of vinylidene chloride/ethyl acrylate/itaconic acid as in example IV of assignee's patent to Alles, U.S. Pat. No. 2,627,088. The coating of solution M was made, using a 0.002-inch doctor blade spacing. After the coating dried, a cover sheet of 0.00025 inch thick polyethylene terephthalate was laminated to the element.

The element was exposed for 1 minute through a halftone transparency to the Nu Arc xenon light source from the cover sheet side. The cover sheet was then stripped from the element at room temperature and a paper image receptive support was pressed to the element between heated rollers at 85° C. and immediately separated from the element. Transfer of the nonpolymerized areas was obtained with excellent tonal range image quality.

EXAMPLE XI

To Composition No. 7 of example XIX, Alles application U.S. Ser. No. 560,889, was added 0.3 g. of yellow dye (see example V). In carrying out the remaining steps of the example XIX it was found that the resulting plate with the yellow dye yielded improved image quality with no loss in speed when compared to a plate containing Composition No. 7 as shown in the above example XIX.

EXAMPLE XII

A solution was prepared by following the method shown in example IX for making solution M, except that 130.8 g. of dipentaerythritol tetraacrylate (see U.S. Pat. No. 3,261,686) instead of pentaerythritol triacrylate was used as the monomeric material. The solution was coated onto an aluminum plate as in example IX and the same overcoating solution was used. The resulting plate gave tonal range and image quality results that were not significantly different from those of the overcoated plate in example IX.

EXAMPLE XIII

Solution M of example IX was coated and overcoated by similar means on a clean copper plate. Exposure was made for 1 minute to the Nu Arc xenon light source. Development in the same processing solutions as the plate in example IX gave tonal range and image quality results that were not significantly different.

Advantages of the invention have been described above. Other advantages are apparent from the above description. The utility of the invention has been demonstrated. The elements are simple, dependable and embody available chemicals, and there are no difficulties in manufacture of the elements.

The embodiments of the invention in which an exclusive property or privilege is claimed are defined as follows:

1. A photopolymerizable element comprising a support and a photopolymerizable layer comprising:

a. at least one nongaseous ethylenically unsaturated monomer having a boiling point greater than 100° C. at normal atmospheric pressure and being capable of forming a polymer by photoinitiated addition polymerization, b. an organic, free-radical-generating addition polymerization polynuclear quinone initiator activatable by actinic radiation in the ultraviolet and/or visible region of the spectrum, and c. an organic macromolecular organic polymer binder for the monomer and initiator, characterized in that the layer contains in an amount constituting 0.25percent–2.7 percent by weight of the solids content of the layer of at least one photographic silver halide sensitizing, yellow, light-absorbing dye selected from the group consisting of 1. oxazoline styryl salts of the formula:

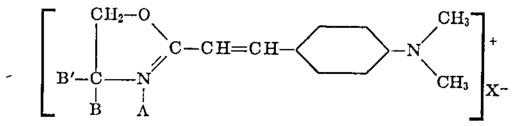

where A is an alkyl group of from one to 18 carbon atoms; B and B′ are alkyl or hydroxyalkyl groups of from one to five carbon atoms or hydrogen; and X is an anion of an acid;

2. Symmetrical thiazoline carbocyanine salts of the formula:

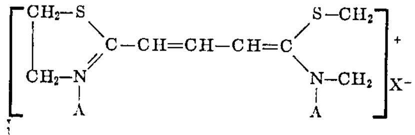

where A and X are the same as in item (1), and

3. Pyrazolinone styryl dye of the formula:

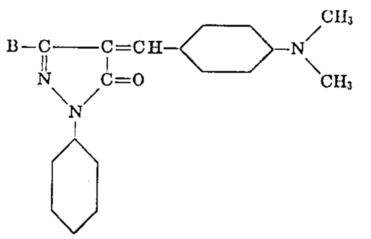

where B is alkyl of from one to five carbons; which salts or dye absorb light in at least one of the ultraviolet and visible regions of the spectrum.

2. An element according to claim 1 wherein the monomer contains at least two terminal ethylenic groups.

3. An element according to claim 1 wherein said support is thin and flexible and said element is flexible.

4. An element according to claim 1 wherein the support is a thin flexible organic polymer film and the layer has a coating weight of 1 to 90 mg./dm.$^2$.

5. An element according to claim 1 wherein said initiator is phenanthrenequinone, the monomer is pentaerythritol triacrylate and the polymer binder is poly(methyl methacrylate/methacrylic acid).

6. An element according to claim 1 wherein the layer contains a nonsensitizing dye that absorbs light in the ultraviolet and/or visible region of the spectrum.

7. An element according to claim 1 wherein the dye is a 3-hexadecyl-4-hydroxymethyl-4-methyl,2-p-dimethyl styryl oxazoline salt of an acid.

* * * * *